United States Patent [19]

Utaka et al.

[11] Patent Number: 4,852,108
[45] Date of Patent: Jul. 25, 1989

[54] WAVELENGTH TUNABLE SEMICONDUCTOR LASER WITH NARROW BAND-PASS ACTIVE FILTER REGION

[75] Inventors: Katsuyuki Utaka, Musashino; Kazuo Sakai, Tokyo; Yuichi Matsushima, Tanashi, all of Japan

[73] Assignee: Kokusai Denshin Denwa Kabushiki Kaisha, Tokyo, Japan

[21] Appl. No.: 216,397

[22] Filed: Jul. 7, 1988

[30] Foreign Application Priority Data

Jul. 21, 1987 [JP] Japan .................................. 62-179898

[51] Int. Cl.$^4$ ............................ H01S 3/10; H01S 3/19
[52] U.S. Cl. ......................................... 372/20; 372/32; 372/50; 372/96; 372/704
[58] Field of Search ....................... 372/50, 45, 20, 32, 372/96, 704

[56] References Cited

U.S. PATENT DOCUMENTS 4,719,636 1/1988 Yamaguchi ........................... 372/50

Primary Examiner—James W. Davie
Attorney, Agent, or Firm—Emmanuel J. Lobato; Robert E. Burns

[57] ABSTRACT

A semiconductor laser is disclosed in which a light emitting region having a light emitting layer and a waveguide region having a waveguide layer which is coupled to at least one side of the light emitting layer with a high efficiency are integrated on the same substrate; the light emitting region includes an active filter section having a diffraction grating equipped with a band-pass filter function; the light emitting region and the waveguide region are electrically isolated and are each provided with an electrode; and the oscillation wavelength of the semiconductor lase is changed by changing the refractive indices of at least the waveguide region and the active filter section through voltage application or current injection to the electrodes, thereby producing a narrow-linewidth, single-wavelength oscillation output light of a wavelength which corresponds to the transmission wavelength of the active filter section determined by the preset refractive indices of the waveguide region and the active filter section.

3 Claims, 3 Drawing Sheets

WAVELENGTH TUNABLE SEMICONDUCTOR LASER WITH NARROW BAND-PASS ACTIVE FILTER REGION

BACKGROUND OF THE INVENTION

The present invention relates to a variable wavelength semiconductor laser of a narrow linewidth.

The semiconductor laser has already been put to practical use as a light source for optical fiber communication because it is small, highly efficient and highly reliable. Systems heretofore employed take advantage of the direct modulation capability that is one of the outstanding features of the semiconductor laser, and one of such conventional systems is what is called a direct intensity modulation-direct detection (DIM-DD) system in which intensity-modulated light corresponding to the amount of current injected into the semiconductor laser is received directly by a photodiode or avalanche photodiode after being propagated through an optical fiber. A dynamic single wavelength laser which stably operates at a single wavelength even during high-speed modulation, such as a distributed feedback (DFB) semiconductor laser, has been developed for use as the light source in the DIM-DD system, with a view to lessening the influence of dispersion by a single mode fiber so as to increase the repeater spacing.

On the other hand, it is possible to substantially improve the receiving sensitivity and hence increase the repeater spacing more than in the DIM-DD system by positively utilizing the properties of a wave itself of light, such as its frequency and phase. This system is referred to as a coherent transmission system, which is being given much study experimentally as well as in its theoretical aspect and is now considered promising as a future optical communication system (see T. Okoshi, Journal of Lightwave Technology, Vol. LT-2, pp. 341-346, 1984, for example). Because of its property, the coherent transmission system requires that the light source at the transmitting side and the light source as a local oscillator at the receiving side be small in linewidth and variable in wavelength. In studies made so far on a laboratory scale, intended primarily for evaluating the potential of the system, it is customary to attain the highly coherent and tunable output by a gas laser of an extremely narrow linewidth or a more practical ordinary semiconductor laser in which an external diffraction grating is provided and only a specific wavelength is fed back thereby to the laser. Since the light emitting region of the semiconductor laser is as small as about 1 μm in diameter, however, such a structure in which the light source and the external diffraction grating are not formed unitary with each other is readily affected by mechanical vibration and heat variation, unstable in providing desired characteristics and involves a large-scale system configuration; apparently such a laser structure is impractical.

For the reduction of the linewidth it is an effective method to increase the cavity length of the laser. However, conventional semiconductor lasers of the type have not yet a stable narrow linewidth characteristic.

SUMMARY OF THE INVENTION

It is therefore an object of the present invention to provide a tunable wavelength semiconductor laser of a narrow linewidth which is employed as a single wavelength light source.

According to the present invention, the light emitting region and the waveguide region are integrated and an active filter section including a diffraction grating equipped with a filter function is provided in a portion of the light emitting region, for selecting only one resonant wavelength to ensure stable operation at a single wavelength of a narrow linewidth. The oscillation wavelength is changed by adjusting the refractive indices of the active filter section and the waveguide region relative to each other.

BRIEF DESCRIPTION OF THE DRAWINGS

The present invention will be described in detail below in comparison with prior art with reference to the accompanying drawing, in which.

DETAILED DESCRIPTION

To make differences between prior art and the present invention clear, an example of prior art will first be described.

Figure 1:
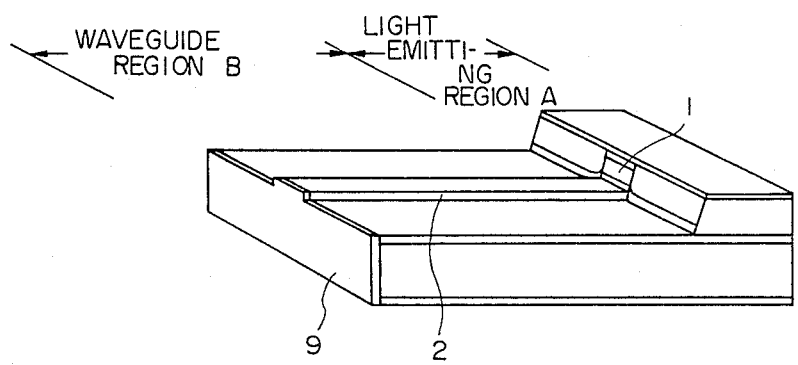
FIG. 1 is a schematic diagram of a conventional semiconductor laser having a long cavity.

For the reduction of the linewidth it is an effective method to increase the cavity length of the laser. A semiconductor laser in which a waveguide region B is monolithically integrated with a light emitting region A to provide a long cavity structure as depicted in FIG. 1 has been studied by T. Fujita et al. and it has been reported that a linewidth as low as 900 kHz was obtained with an about 1.8 mm cavity length (Electronics Letters, Vol. 21, pp. 374-376, 1985). In FIG. 1 reference numeral 1 indicates an InGaAsP light emitting layer, 2 an InGaAsP waveguide layer formed on an extension of the InGaAsP light emitting layer 1, and 9 a metallic film for increasing the reflectivity of a cleaved facet. In general, however, as the cavity becomes longer, the resonant wavelength spacing also becomes narrower correspondingly, resulting in the defects that the semiconductor laser is liable to provide multiple wavelength oscillation and that its narrow linewidth characteristic also readily becomes unstable. In addition, wavelength tuning involves the selection of resonant wavelengths discretely, and hence is not continuous, and accordingly this semiconductor laser is not suitable for practical use.

With reference to the accompanying drawings, the present invention will hereinafter be described in detail.

(1st Embodiment)

Figure 2:
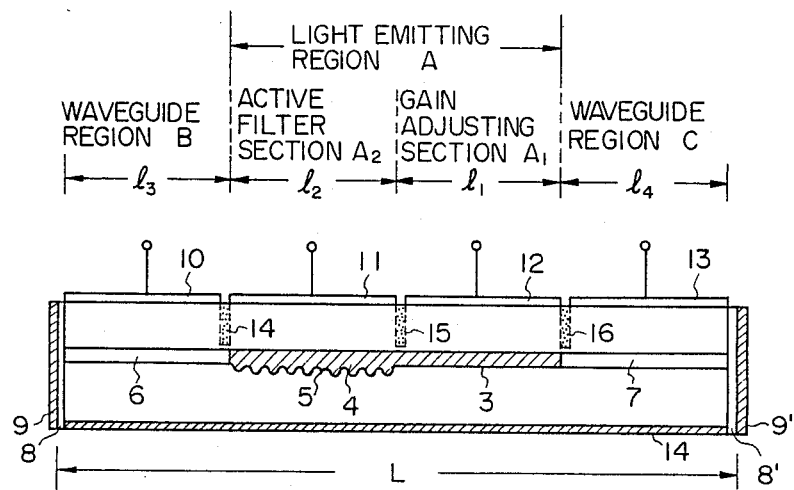
FIG. 2 is a cross-sectional view of a semiconductor laser according to a first embodiment of the present invention.

FIG. 2 illustrates a first embodiment of the present invention. In FIG. 2, reference numerals 3 and 4 indicate light emitting layers of substantially or exactly the same composition and constituting the light emitting region A which has an optical gain resulting from the injection thereinto of current. The light emitting region A comprises two sections, one of which is an active filter section $A_2$ in which a phase-shifted diffraction grating 5 equipped with a band-pass filter function is formed along the light emitting layer 4 and the other of which is a gain adjusting section $A_1$ in which the light emitting layer 3 is provided. Disposed at both sides of the light emitting region A are waveguide regions B and C which have low-loss waveguide layers 6 and 7 coupled to the light emitting region with high efficiency, and a pair of reflecting end facets are disposed at opposite ends of the laser. Incidentally, in this embodiment the reflecting end facets are shown to be highly reflective end facets which are formed by metallic films 9 and 9' coated on dielectric films 8 and 8'. The light emitting layers 3 and 4 and the waveguide layers 6 and 7 are each sandwiched between semiconductor layers of different conductivity types, and the respective regions and sections are provided with electrodes 10, 11, 12 and 13 for independent control. Reference numeral 18 designates a lower electrode, and 14, 15 and 16 high resistance regions for electrical isolation, which can be obtained by implanting protons, for instance.

Next, the operation of this embodiment will be described.

Figure 3:
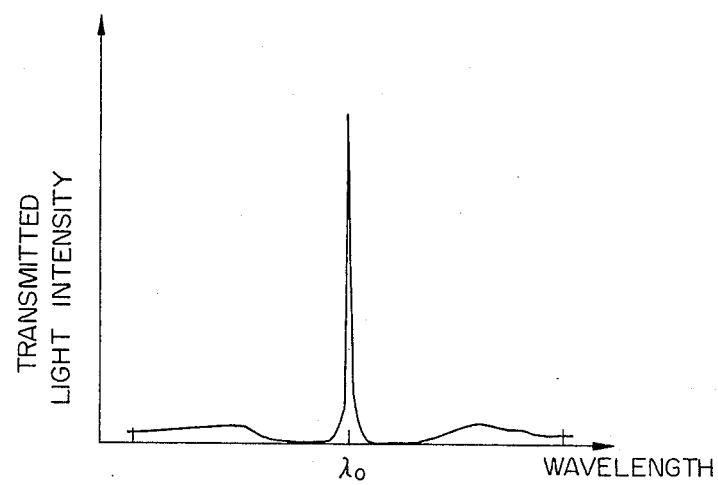
FIG. 3 is a graph showing the transmission spectral characteristic of an active filter having a λ/4 shift diffraction grating for use in the present invention.

In FIG. 3 there is shown a transmission spectral characteristic of the phase-shifted diffraction grating, for example, $\lambda/4$ shift diffraction grating 5 in the case where it has a gain. Letting the period and the refractive index of the diffraction grating 5 be represented by $\Lambda$ and $n_2$, respectively, the gain is effectively provided only at the center wavelength given by $\lambda_0 = 2\Lambda n_2$; and so that the diffraction grating serves as an active filter which has such a sharp band-pass characteristic as shown in FIG. 3. On the other hand, if end-facet reflection exists, the sharp characteristic of the $\lambda/4$ shift diffraction grating 5, such as shown in FIG. 3, may sometimes be impaired depending on the phase of reflected light, but this can be avoided by changing the refractive indices of the waveguide layers 6 and 7 of the waveguide regions B and C positioned between the active filter section $A_2$ and the reflecting end facets through current injection or voltage application so that the phase of reflected light may be optimum. Incidentally, if the phase of reflected light could be changed by $2\pi$ at most, then it could be adjusted to an optimum value within this range. Assuming, for example, that the sum of the length $l_3$ or $l_4$ of the waveguide region B or C and the length $l_1$ of the gain adjusting section $A_1$, $(l_4 + l_1)$, is 500 $\mu$m, only a refractive index change $\Delta n$ of 0.001 is enough to obtain the aforementioned phase change $2\pi$. This can be done by current injection which needs only to cause a change in carrier density as small as $\Delta N$ to about $2 \times 10^{17}$ cm$^{-3}$. In case of utilizing the electrooptic effect by voltage application, such a refractive index change can be also achieved by applying a voltage about $\frac{1}{3}$ of a breakdown voltage. The latter method of adjusting the refractive index by voltage application needs only to apply a reverse bias and maintains the semiconductor laser in a low-loss state because it does not involve any carrier injection. Accordingly, such a phase adjustment ensures the oscillation of the semiconductor laser at the single wavelength $\lambda_0$. At the same time, the linewidth can be reduced by selecting the overall length L of the cavity to be large.

On the other hand, the oscillation wavelength can be changed by changing the refractive index $n_2$ of the light emitting layer 4, in which the $\lambda/4$ shift diffraction grating 5 is provided, in accordance with the injected carrier density. By the way, the oscillation wavelength can be changed over a range $\Delta \lambda_0$ of about 50 Å by changing the carrier density in the range $\Delta N$ of about $1 \times 10^{18}$ cm$^{-3}$. Such a change in the carrier density of the active filter section $A_2$ causes a change also in the gain of the section $A_2$, incurring the possibility that the optical output also fluctuates. However, this problem can be solved by adding the gain adjusting section $A_1$ and adjusting the current injection to make the overall gain substantially constant. It is also possible to optimize the phase of reflected light by adjusting the refractive indices of the waveguide regions B and C in accordance with such a change in the oscillation wavelength as mentioned above.

A stable-operation, narrow-linewidth, single-wavelength semiconductor laser can be implemented by changing the refractive index of the $\lambda/4$ shift active filter region and, at the same time, optimizing the gains and refractive indices of the other regions as described above.

(2nd Embodiment)

Figure 4:
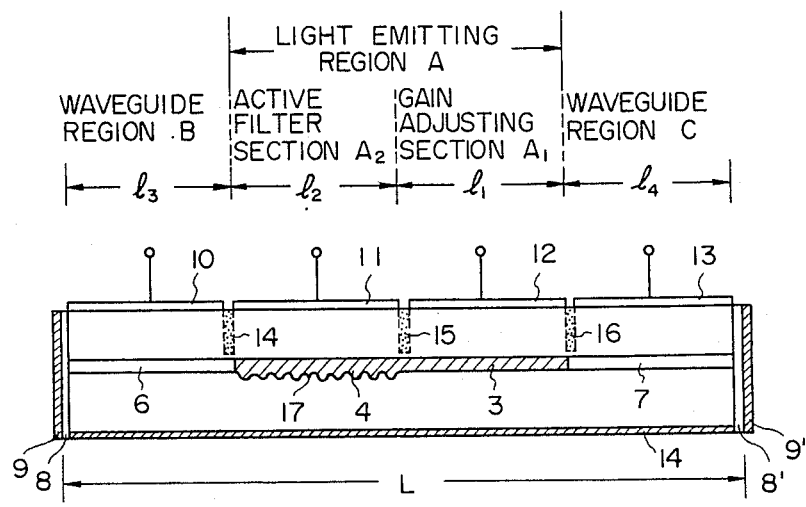
FIG. 4 is a cross-sectional view of a semiconductor laser according to a second embodiment of the present invention.

FIG. 4 illustrates, in section, a second embodiment of the semiconductor laser of the present invention which has a uniform diffraction grating 17 formed in the active filter section $A_2$.

Figure 5:
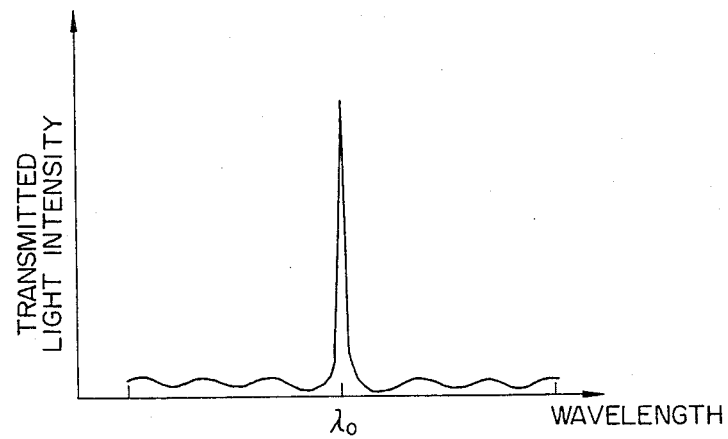
FIG. 5 is a graph showing the transmission spectral characteristic of an active filter having a uniform diffraction grating for use in the present invention.

FIG. 5 shows the transmitted light-intensity spectral characteristic of the uniform diffraction grating active filter under an appropriate phase condition of reflected light. As is the case with FIG. 3, an excellent band-pass characteristic can be obtained at the center wavelength $\lambda_0$ which is substantially dependent on the period of the diffraction grating and the refractive index of the active filter section $A_2$. This embodiment is identical in construction, function and effect with the first embodiment of FIG. 2 except that the uniform diffraction grating 17 is used in place of the $\lambda/4$ shift diffraction grating 5.

While in the above embodiments the gain adjusting region $A_1$ is provided between the waveguide regions B and C, the same effect as mentioned above would be obtainable even if the gain adjusting region is disposed outside the waveguide region B or C. Since the waveguide layers 6 or 7 is intended primarily for adjusting the phase of reflected light, the purpose could be served even by a semiconductor layer which has a composition close to that of the light emitting layer and has a gain.

Although in the above the present invention has been described to employ the direct coupling structure for optically coupling the light emitting layer and the waveguide layers, the invention is also applicable to other coupling methods including an LOC (Large Optical Cavity) structure. Moreover, the foregoing embodiments have been described in connection with reflection between a pair of end facets, but distributed Bragg reflectors (DBR) may also be used as a pair of reflectors and their use is rather convenient for monolithic integration with other devices because the output light can be obtained through the waveguide. Although no particular reference has been made to a strip structure for confining light in a transverse direction, all transverse mode confinement structures including a buried structure can be applied to. As for semiconductor materials all compound semiconductor crystals which can be used for the semiconductor laser, such as InGaAsP-/InP, AlGaAs/GaAs, InAlGaAs/InP and AlGaAsSb-/GaAs, can be employed.

As described above, according to the present invention, the active filter section $A_2$ having a diffraction grating is provided in a portion of the light emitting region A to yield an excellent single wavelength transmission characteristic, by which multi-wavelength oscillation can be suppressed which occurs when the length of the cavity is increased for the purpose of reducing the linewidth. In other words, a semiconductor laser can be implemented which is small in linewidth and stably operates at a single wavelength which can also be changed by changing the refractive indices of the active filter section $A_2$ and the waveguide regions B and C. Accordingly, the semiconductor laser of the present invention is very promising as a light source for coherent transmission and other optical measurements, and hence is of great utility in practical use.

What we claim is:

1. A semiconductor laser comprising:

a substrate;

a light emitting region having a light emitting layer and integrated on the substrate;

a waveguide region having a waveguide layer coupled to but electrically isolated from at least one side of the light emitting layer with a high efficiency and integrated on the substrate;

an active filter having a diffraction grating of a bandpass filter function and provided in the light emitting region;

electrodes separated from one another for individually energizing the light emitting region and the waveguide region, so that the oscillation wavelength of the semiconductor laser is changed by changing the refractive indices of at least the waveguide region and the active region through said energizing, thereby producing a narrow-linewidth, single-wavelength oscillation output light of a wavelength which corresponds to the transmission wavelength of the active filter section determined by the present refractive indices of the waveguide region and the active filter section.

2. A semiconductor laser according to claim 1, in which said diffraction grating is a $\lambda/4$ diffraction grating.

3. A semiconductor laser according to claim 1, in which said diffraction grating is a uniform diffraction grating.

* * * * *